US008735221B2

(12) United States Patent
Yoo et al.

(10) Patent No.: US 8,735,221 B2
(45) Date of Patent: May 27, 2014

(54) STACKED PACKAGE, METHOD OF FABRICATING STACKED PACKAGE, AND METHOD OF MOUNTING STACKED PACKAGE FABRICATED BY THE METHOD

(75) Inventors: Jae-Wook Yoo, Suwon-si (KR); Sun-Kyoung Seo, Suwon-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 141 days.

(21) Appl. No.: 13/242,183

(22) Filed: Sep. 23, 2011

(65) Prior Publication Data
US 2012/0252163 A1  Oct. 4, 2012

(30) Foreign Application Priority Data
Nov. 29, 2010  (KR) .................. 10-2010-0119762

(51) Int. Cl.
*H01L 21/00* (2006.01)

(52) U.S. Cl.
USPC ........... 438/119; 438/109; 438/118; 438/615; 257/686; 257/738; 257/E21.508

(58) Field of Classification Search
USPC .......... 438/109, 118, 119, 615; 257/686, 738, 257/E21.508
See application file for complete search history.

(56) References Cited

U.S. PATENT DOCUMENTS

| | | | | |
|---|---|---|---|---|
| 5,895,229 | A * | 4/1999 | Carney et al. ............. | 438/106 |
| 6,504,105 | B1 * | 1/2003 | Acocella et al. ........... | 174/255 |
| 7,265,442 | B2 * | 9/2007 | Henttonen ................. | 257/686 |
| 7,977,156 | B2 | 7/2011 | Lee et al. | |
| 2003/0030149 | A1 * | 2/2003 | Miura et al. .............. | 257/772 |
| 2005/0003587 | A1 * | 1/2005 | Shiozawa ................. | 438/126 |
| 2005/0263868 | A1 * | 12/2005 | Aoyagi .................... | 257/686 |

FOREIGN PATENT DOCUMENTS

| | | |
|---|---|---|
| JP | 2007-294560 | 11/2007 |
| JP | 2008-270303 | 11/2008 |
| KR | 2009-0123680 | 12/2009 |

OTHER PUBLICATIONS

Chart of Indalloy Specialy Alloys by Indium Corporation of America, Europe and Asia.*

* cited by examiner

*Primary Examiner* — Kimberly Rizkallah
*Assistant Examiner* — Maria Ligai
(74) *Attorney, Agent, or Firm* — Muir Patent Consulting, PLLC

(57) ABSTRACT

Provided are a stacked package, method of fabricating a stacked package, and method of mounting a stacked package. A method includes providing an upper semiconductor package including an upper package substrate, upper semiconductor chips formed on a top surface of the upper package substrate, and first solders formed on a bottom surface of the upper package substrate and having a first melting temperature, providing a lower semiconductor package including a lower package substrate, lower semiconductor chips formed on a top surface of the lower package substrate, and solder paste nodes formed on the top surface of the lower package substrate and having a second melting temperature lower than the first melting temperature, and forming inter-package bonding units by attaching respective first solders and solder paste nodes to each other by performing annealing at a temperature higher than the second melting temperature and lower than the first melting temperature.

19 Claims, 8 Drawing Sheets

STACKED PACKAGE, METHOD OF FABRICATING STACKED PACKAGE, AND METHOD OF MOUNTING STACKED PACKAGE FABRICATED BY THE METHOD

CROSS-REFERENCE TO RELATED APPLICATION

This application claims priority from Korean Patent Application No. 10-2010-0119762 filed on Nov. 29, 2010 in the Korean Intellectual Property Office, and all the benefits accruing therefrom under 35 U.S.C. 119, the contents of which in its entirety are herein incorporated by reference.

BACKGROUND

1. Field

The present disclosure relates to a stacked package, a method of fabricating a stacked package, and a method of mounting the stacked package fabricated by the same.

2. Description of the Related Art

In recent years, as semiconductor device applications continue to demand ever higher performance, certain semiconductor chip sizes and package sizes are increasing. With the trend of electronic devices toward slimness, a thickness of a printed circuit board (PCB) on which packages are mounted often needs to be reduced. As a result, when semiconductor packages are mounted on the PCB, a serious warpage of a substrate may be caused. The warpage may cause many flaws, including a short circuit between bonding units or delamination from the substrate when the semiconductor package is mounted.

Semiconductor packaging technologies are advancing to meet requirements for multi-functioning, high capacity and miniaturization. To meet the requirements, system in package (SIP) technologies have been proposed, in which different semiconductor packages are integrated into one package, thereby expanding the capacity and functions of the semiconductor package while greatly reducing the size of the semiconductor package.

One way of the SIP technologies is to stack semiconductor packages to form a package on package (POP) or a stacked package after each individual semiconductor package undergoes discrete packaging and electrical testing. During the stacking, undesirable warpage of various substrates may occur.

SUMMARY

The present disclosure provides a stacked package, a method of fabricating a stacked package, which can be easily fabricated and can minimize a load applied to the package while suppressing warpage generated when mounting the package, and a method of mounting a stacked package fabricated by the method of fabricating the stacked package.

The above and other objects of the present disclosure will be described in or be apparent from the following description of various embodiments.

According to one embodiment, there is provided a method of fabricating a stacked package including providing an upper semiconductor package including an upper package substrate, upper semiconductor chips formed on a top surface of the upper package substrate, and first solders formed on a bottom surface of the upper package substrate and having a first melting temperature, providing a lower semiconductor package including a lower package substrate, lower semiconductor chips formed on a top surface of the lower package substrate, and solder paste nodes formed on the top surface of the lower package substrate and having a second melting temperature lower than the first melting temperature, and forming inter-package bonding units by attaching respective first solders and solder paste nodes to each other by performing annealing at a temperature higher than the second melting temperature and lower than the first melting temperature.

According to another embodiment, a method of mounting the stacked package is disclosed. The method includes providing the stacked semiconductor package fabricated by the method of claim 1, wherein in the forming of the inter-package bonding unit, the solder paste nodes are transformed into a material having a third melting temperature higher than the second melting temperature, and the inter-package bonding unit includes the transformed solder paste nodes and the first solders; forming second solders on a bottom surface of the lower package substrate, the second solders having a fourth melting temperature lower than the first and third melting temperatures; and mounting the stacked semiconductor package on a package mounting board by attaching the package mounting board to the second solders by performing annealing at a temperature higher than the fourth melting temperature and lower than the first and third melting temperatures.

According to a further embodiment, a method of fabricating a stacked semiconductor package is disclosed. The method comprises providing an upper semiconductor package including an upper package substrate, one or more upper semiconductor chips formed on a first surface of the upper package substrate, and either first solders or first solder paste nodes formed on a second surface of the upper package substrate and having a first melting temperature; and providing a lower semiconductor package including a lower package substrate, one or more lower semiconductor chips formed on a first surface of the lower package substrate, and either second solder paste nodes or second solders formed on the first surface of the lower package substrate and having a second melting temperature. If the first solders are provided then the second solder paste nodes are provided and the second melting temperature is lower than the first melting temperature, and if the first solder paste nodes are provided then the second solders are provided and the second melting temperature is higher than the first melting temperature. The method additionally includes forming inter-package bonding units by bonding either the first solders and the second solder paste nodes to each other or the first solder paste nodes and the second solders to each other by performing annealing at a temperature between the second melting temperature and the first melting temperature.

In another embodiment, a stacked semiconductor package is disclosed. The package includes an upper semiconductor package including an upper package substrate and one or more upper semiconductor chips formed on the upper package substrate, a first surface of the upper semiconductor package substrate including first bonding pads for connecting to outside the upper semiconductor package; a lower semiconductor package including a lower package substrate and one or more lower semiconductor chips formed on the lower package substrate, a first surface of the lower semiconductor package substrate including second bonding pads for connecting to outside the lower semiconductor package; and inter-package bonding units electrically and physically connecting the first bonding pads to respective ones of the second bonding pads. The inter-package bonding units include first solders having a first melting temperature in contact with first respective annealed solder paste nodes having a second melting temperature.

In another embodiment, an inter-substrate bonding unit for electrically and physically connecting a first semiconductor substrate of a first semiconductor package to a second semiconductor substrate of a second semiconductor package is disclosed. The inter-substrate bonding unit includes a first solder having a first melting temperature, the first solder connected to a bonding pad on a surface of the first semiconductor substrate; and an annealed solder paste node having a second melting temperature, the annealed solder paste node connected to a bonding pad on a surface of the second semiconductor substrate and connected to the first solder. The annealed solder paste node has a melting temperature prior to annealing lower than the first melting temperature and lower than the second melting temperature.

BRIEF DESCRIPTION OF THE DRAWINGS

The above and other features and advantages will become more apparent by describing in detail various embodiments thereof with reference to the attached drawings in which.

DETAILED DESCRIPTION

Figure 1:
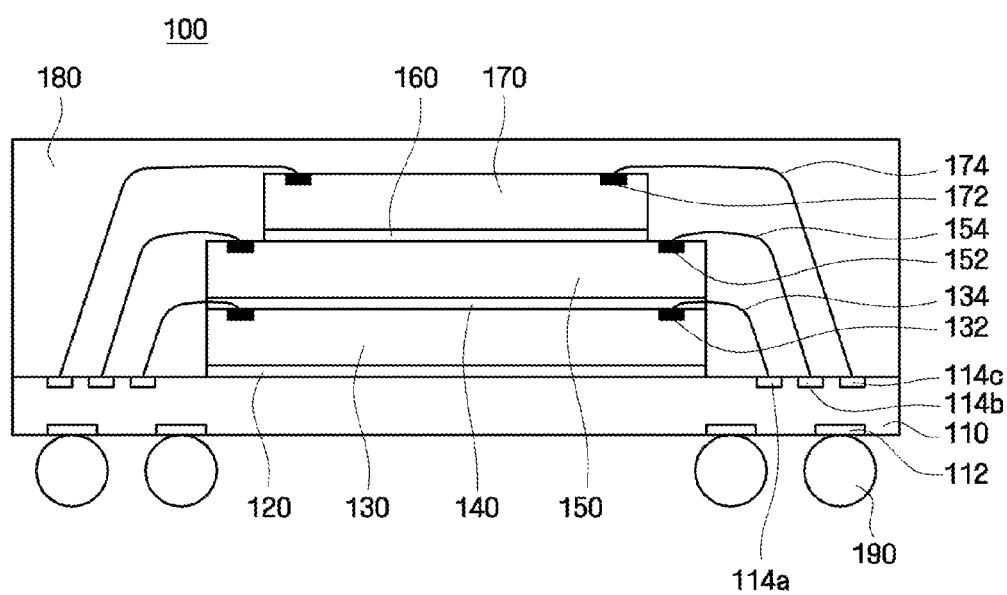
FIGS. 1 to 5 are cross-sectional views illustrating a stacked package and a method of fabricating a stacked package according to one exemplary embodiment.

The present disclosure will now be described more fully hereinafter with reference to the accompanying drawings, in which certain embodiments are shown. This invention may, however, be embodied in different forms and should not be construed as limited to the embodiments set forth herein. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

In the following description, technical terms are used for explaining specific embodiments while not limiting the disclosed embodiments. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Also, though terms like a first, a second, and a third are used to describe various elements, regions, and layers in various embodiments, the elements, regions, and the layers are not limited to these terms. Unless indicated as otherwise, these terms are used only to discriminate one element, region, or layer from another element, region, or layer.

Terms such as "same," "planar," or "coplanar," as used herein when referring to orientation, location, shapes, sizes, amounts, or other measures do not necessarily mean an exactly identical orientation, location, shape, size, amount, or other measure, but are intended to encompass nearly identical orientation, location, shapes, sizes, amounts, or other measures within acceptable variations that may occur, for example, due to manufacturing processes.

The present disclosure will be described with reference to perspective views, cross-sectional views, and/or plan views, in which certain embodiments of the invention are shown. Thus, the profile of an exemplary view may be modified according to manufacturing techniques and/or allowances. That is, the disclosed embodiments are not intended to limit the scope of the disclosure, but cover all changes and modifications that can be caused due to a change in manufacturing process. Thus, regions shown in the drawings are illustrated in schematic form and the shapes of the regions (e.g., circular elements, elements having 90 degree angles or with sharp edges, etc.) are presented to illustrate certain embodiments, and not as a limitation.

Hereinafter, a stacked package, a method of fabricating a stacked package, and a method of mounting the stacked package fabricated by the same will be described, in accordance with one embodiment, with reference to FIGS. 1 to 6. FIGS. 1 to 5 are cross-sectional views illustrating a method of fabricating a stacked package according to an exemplary embodiment, and FIG. 6 is a cross-sectional view illustrating an exemplary method of mounting a stacked package fabricated by the method shown in FIGS. 1 to 5.

Referring to FIG. 1, a first semiconductor package, such as upper semiconductor package 100 is provided. In one embodiment, the upper semiconductor package 100 includes an upper package substrate 110, upper semiconductor chips 130, 150 and 170 formed on a first surface of the upper package substrate 110 (e.g., a top surface), upper molding member 180 formed on the top surface of the upper package substrate 110 and covering the upper semiconductor chips 130, 150 and 170, and first solders 190 formed on a second (e.g., bottom) surface of the upper package substrate 110. A method of forming the upper semiconductor package 100 according to one exemplary embodiment will now be described in more detail.

First, the upper package substrate 110 having associated wirings, pads, lands, and so on, formed on its top and bottom surfaces is provided. In this embodiment, first to third wire bonding pads 114a, 114b, and 114c are formed on a top surface of the upper package substrate 110 and first bonding pads 112 are formed on a bottom surface of the upper package substrate 110. The first to third wire bonding pads 114a, 114b, and 114c are to be electrically connected to the upper semiconductor chips 130, 150 and 170 by a wire bonding process to be described later. The first to third wire bonding pads 114a, 114b, and 114c may be disposed in the vicinity of the upper semiconductor chips 130, 150 and 170, for example, at both sides of the upper semiconductor chips 130, 150 and 170. The first bonding pads 112 are provided, in one embodiment, for electrically connecting the upper semiconductor package 100 and the upper package substrate 110 to outside of the upper semiconductor package 100, e.g., to the lower semiconductor package, as described later, and may be disposed in a region where an inter-package bonding unit is to be formed in a subsequent process.

Next, first to third upper semiconductor chip 130, 150 and 170 are mounted on the top surface of the upper package substrate 110. In one embodiment, the first to third upper semiconductor chips 130, 150 and 170 may be mounted by a wire bonding process. In detail, in one embodiment, the first upper semiconductor chip 130 is attached to the top surface of the upper package substrate 110 using, for example, an insulating adhesive 120, followed by performing wire bonding, thereby connecting chip pads 132 on a top surface of the first upper semiconductor chip 130 to first wire bonding pads 114a using wires 134. Next, the second upper semiconductor chip 150 is attached to the top surface of the first upper semiconductor chip 130 using, for example, an insulating adhesive 140, followed by performing wire bonding, thereby connecting chip pads 152 on a top surface of the second upper semiconductor chip 150 to second wire bonding pads 114b using wires 154. Next, the third upper semiconductor chip 170 is attached to a top surface of the second upper semiconductor chip 150 using, for example, an insulating adhesive 160, followed by performing wire bonding, thereby connecting chip pads 172 on a top surface of the third upper semiconductor chip 170 to third wire bonding pads 114c using wires 174.

While three semiconductor chips 130, 150 and 170 are vertically stacked in the upper semiconductor package 100 shown in this embodiment, the disclosure is not limited thereto and the upper semiconductor package 100 in alternative embodiments may include a single semiconductor chip or a plurality of vertically stacked semiconductor chips in different configurations (e.g., zig-zag configuration, mesa configuration, spiral configuration, etc.). Alternatively, the upper semiconductor package 100 may include vertically stacked semiconductor chips modified so as to increase horizontal widths thereof. In addition, while three semiconductor chips 130, 150 and 170 are mounted by a wire bonding process, the invention is not limited thereto and a flip chip bonding process, for example, or a through via connection process, may also be used.

Next, an upper molding member 180 is formed on the top surface of the upper package substrate 110 so as to cover the upper semiconductor chips 130, 150 and 170. The upper molding member 180 may include an insulating material, such as for example, an epoxy molding compound (EMC) or polyimide.

Next, conductive first solders 190 contacting and electrically connected to first bonding pads 112 are formed on a bottom surface of the upper package substrate 110. The first solders 190 are formed to connect the upper semiconductor package 100 to the lower semiconductor package 200 and may constitute a portion of an inter-package bonding unit. The first solders 190 may be formed to be in contact with the first bonding pads 112 using a soldering process, and may be, for example, solder bumps or solder balls formed of a first solder material. For example, the first solder material may be permanently affixed to the first bonding pads 112 as a result of the soldering process (for example, a melting or annealing process).

In one embodiment, the first solders 190 may have a relatively high melting temperature. In one embodiment, the relatively high melting temperature of the first solders 190 is a melting temperature at which the first solders 190 are not melted in a package stacking process, to later be described (see FIG. 3). Further, the relatively high melting temperature of the first solders 190 may be a melting temperature at which the first solders 190 are not melted in a stacked package mounting process (see FIG. 6). The melting temperature of the first solders 190 is referred to as a first melting temperature. The first solders 190 may include, for example, a Sn—Sb based alloy or a Sn—Ag based alloy. Accordingly, the first melting temperature may be approximately 270° C., but the present disclosure is not limited thereto.

Figure 2:
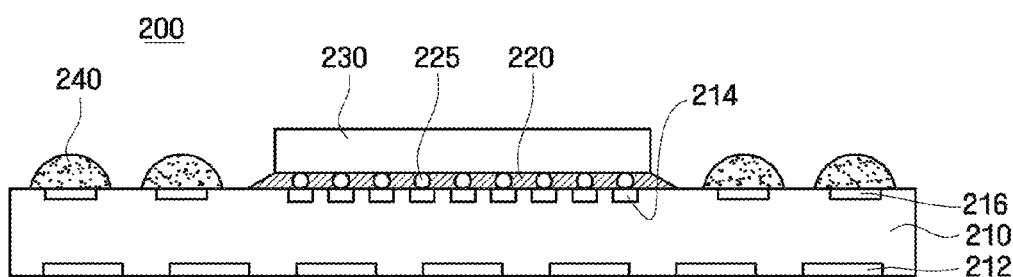

Referring to FIG. 2, a second (e.g., lower) semiconductor package 200 is provided. In one embodiment, the lower semiconductor package 200 includes a lower package substrate 210, a lower semiconductor chip 230 formed on a first surface (e.g., top surface) of the lower package substrate 210, and solder paste nodes 240 formed on the first surface of the lower package substrate 210. A method of forming the lower semiconductor package 200 will now be described in more detail.

First, the lower package substrate 210 having associated wirings, pads, lands, and so on, formed on its top and bottom surfaces is provided. In this embodiment, bonding pads 214 for chip bumps, and second bonding pads 216 are formed on a top surface of the lower package substrate 210, and pads 212 for external connection terminals to the outside are formed on a bottom surface of the lower package substrate 210. In one embodiment, the bonding pads 214 are to be electrically connected to the lower semiconductor chip 230 by a flip chip bonding process to be described later, and may be formed below the lower semiconductor chip 230 in plurality. As an alternative to flip chip bonding, through vias or wire bonding may be used. The second bonding pads 216 are provided for electrically connecting the lower semiconductor package 200 to the aforementioned upper semiconductor package 110, and may be disposed in a region where an inter-package bonding unit to later be described is to be formed. For example, the second bonding pads 216 may be disposed to correspond to the first bonding pads 112. The pads 212 for external connection terminals may be provided for electrically connecting the stacked package to a board on which the stacked package is to be mounted, for example, a module board or a main circuit board. The bonding pads and chip pads described herein disposed at the surfaces of chips or substrates connect to circuitry within the chip or substrate, thereby allowing electrical signals to pass from circuitry on the chip or substrate to a device external to the chip or substrate.

Next, the lower semiconductor chip 230 is mounted on the top surface of the lower package substrate 210. In this embodiment, the lower semiconductor chip 230 may be mounted by a flip chip bonding process. Alternatively, the chip may be mounted without flip chip bonding, but through the use of, for example, through chip vias. In detail, in one embodiment, the lower semiconductor chip 230 includes a plurality of conductive chip bumps 225 formed on its bottom surface by a soldering process. The chip bumps 225 are attached to the bonding pads 214, thereby electrically connecting the lower semiconductor chip 230 to the bonding pads 214. An under-fill layer 220 is filled in a space between the lower semiconductor chip 230 and the lower package substrate 210. The under-fill layer 220 surrounds the chip bumps 225 to protect the chip bumps 225, and increases adhesion between the lower semiconductor chip 230 and the lower package substrate 210.

While the lower semiconductor package 200 in the above embodiment includes a single semiconductor chip 230, which may be mounted by a flip chip bonding process, the present disclosure is not limited thereto and the lower semiconductor package 200 may include a plurality of semiconductor chips, connected, for example, using through chip vias. Alternatively, the semiconductor chip(s) included in the lower semiconductor package 200 may be mounted by a wire bonding process.

Next, conductive solder paste nodes 240 contacting and electrically connected to second bonding pads 216 are formed on the top surface of the lower package substrate 210. The solder paste nodes 240 are formed to connect the lower semiconductor package 200 to the upper semiconductor package 100 and may constitute a portion of the inter-package bonding unit. The solder paste nodes 240 may be formed on the second bonding pads 216 by, for examples, a screen printing process, and may be formed of a solder paste made of a second solder material different from the first solder material of the first solders 190 of the upper semiconductor package 100. For example, each solder paste node, prior to melting or annealing, may comprise solder paste that includes solder particles (e.g., a metal powder) suspended in a flux to form a node that attaches to a surface of a substrate.

In one embodiment, the solder paste has a melting temperature lower than that of the first solders 190. The melting temperature of the solder paste nodes 240 is referred to a second melting temperature. In one embodiment, the solder paste has a relatively low melting temperature at the time when it is formed, but after it is melted by annealing, the solder paste may be transformed into a material having a relatively high melting temperature due to thermal transformation. The solder paste nodes 240 may include, for example, CuSn, or CuSnAg, as a main component. The solder paste nodes 240 may have a melting temperature of 150° C. or less. Once the solder paste nodes 240 are thermally transformed, they may have a melting temperature of 300° C. or higher.

Figure 3:
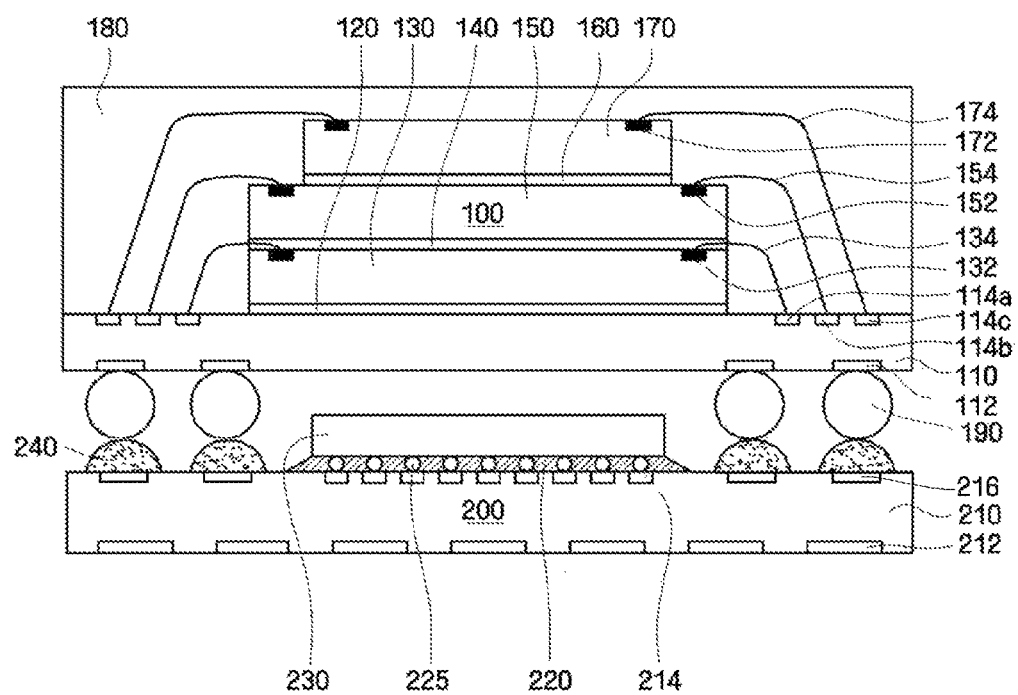

Referring to FIG. 3, a process for stacking the upper semiconductor package 100 on the lower semiconductor package 200 is performed, which will now be described in more detail.

First, the upper semiconductor package 100 is disposed on the lower semiconductor package 200 such that the solder paste nodes 240 formed on the second bonding pads 216 of the lower package substrate 210 contact the first solders 190 formed on the first bonding pad 112 of the upper package substrate 110. The upper package substrate 110 and the lower package substrate 210 are formed to correspond to each other such that the top surface of the lower package substrate 210 faces the bottom surface of the upper package substrate 110.

Next, annealing is performed to attach the first solders 190 and the solder paste nodes 240 to each other. The annealing may be performed, for example, by a reflow process. Here, the annealing is performed at a temperature lower than the first melting temperature of the first solders 190 and higher than the second melting temperature of the solder paste comprising the solder paste nodes 240. In addition, in one embodiment, the annealing is performed at a temperature closer to the second melting temperature than to the first melting temperature. As described above, when the first melting temperature is approximately 270° C. and the second melting temperature is lower than or equal to 150° C., for example, the annealing may be performed at a temperature of, for example, approximately 160° C. When the annealing is performed within the temperature range stated above, the first solders 190 are not melted while the solder paste nodes 240 are melted to then be affixed to the first solders 190.

Figure 4:
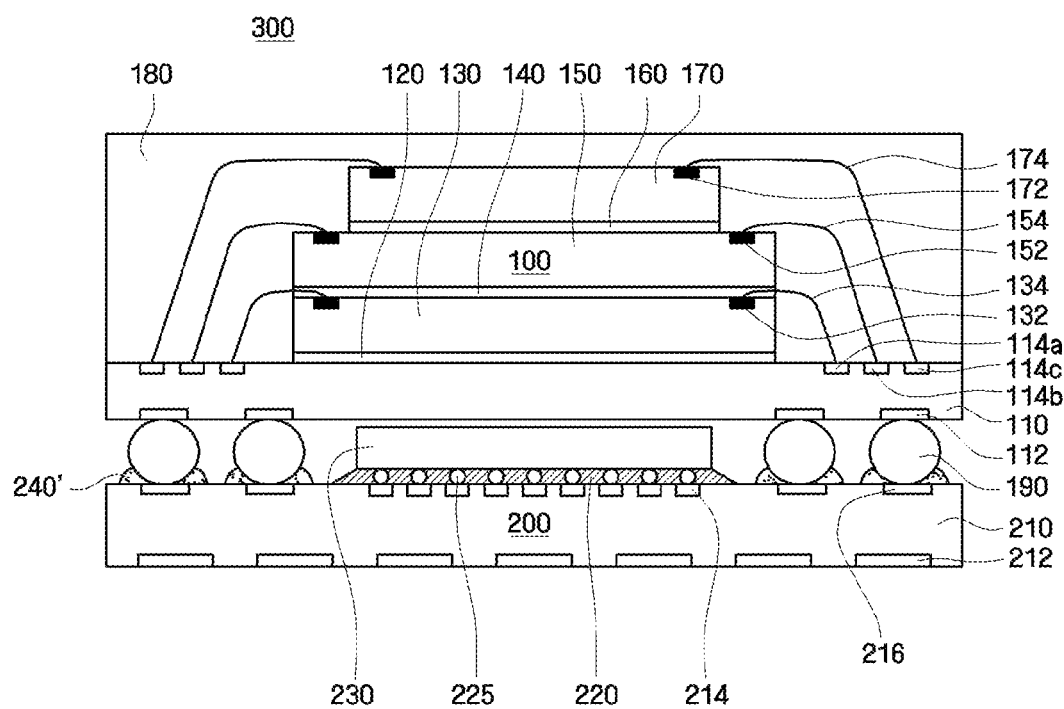

FIG. 4 shows an exemplary resultant product obtained by the process shown in FIG. 3.

Referring to FIG. 4, a structure having the upper semiconductor package 100 stacked on the lower semiconductor package 200, that is to say, a stacked package 300, is formed.

As described above, the solder paste has a relatively low melting temperature at the time when it is formed, and once it is melted by annealing, it may be transformed into a material having a relatively high melting temperature due to thermal transformation. Therefore, a thermally transformed material derived from the solder paste, instead of the solder paste, is disposed in the structure shown in FIG. 4. The thermally transformed material having a relatively high melting temperature, which is produced after the solder paste is melted and then thermally transformed, is referred to as transformed solder paste, and comprises transformed, or annealed, solder paste nodes denoted by reference numeral 240', hereinafter. A melting temperature of the transformed solder paste of the transformed solder paste nodes 240' is referred to as a third melting temperature.

In one embodiment, the relatively high melting temperature of the transformed solder paste nodes 240' is a melting temperature at which the transformed solder paste 240' is not melted in a stacked package mounting process to later be described (see FIG. 6). The third melting temperature of the transformed solder paste may be higher than or equal to the first melting temperature of the first solders 190. As described above, the third melting temperature may be higher than or equal to 300° C.

As a result, referring to FIG. 4, the stacked structures of the transformed solder paste nodes 240' and the first solders 190, disposed between the bottom surface of the upper package substrate 110 and the top surface of the lower package substrate 210, electrically connects the bottom surface of the upper package substrate 110 and the top surface of the lower package substrate. As such, the upper semiconductor package 100 and the lower semiconductor package 200 may be attached to each other by the stacked structure of the transformed solder paste nodes 240' and the first solders 190. The stacked structure of a transformed solder paste node 240' and a first solder 190 is referred to herein as an inter-package bonding unit.

Figure 5:
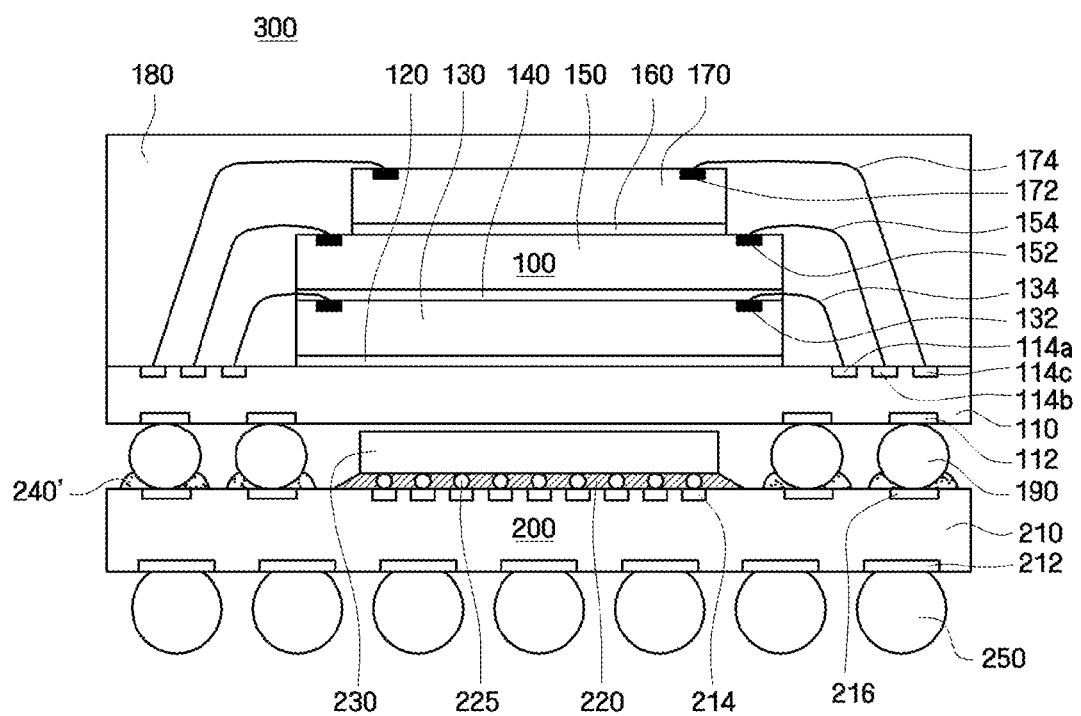
Figure 6:
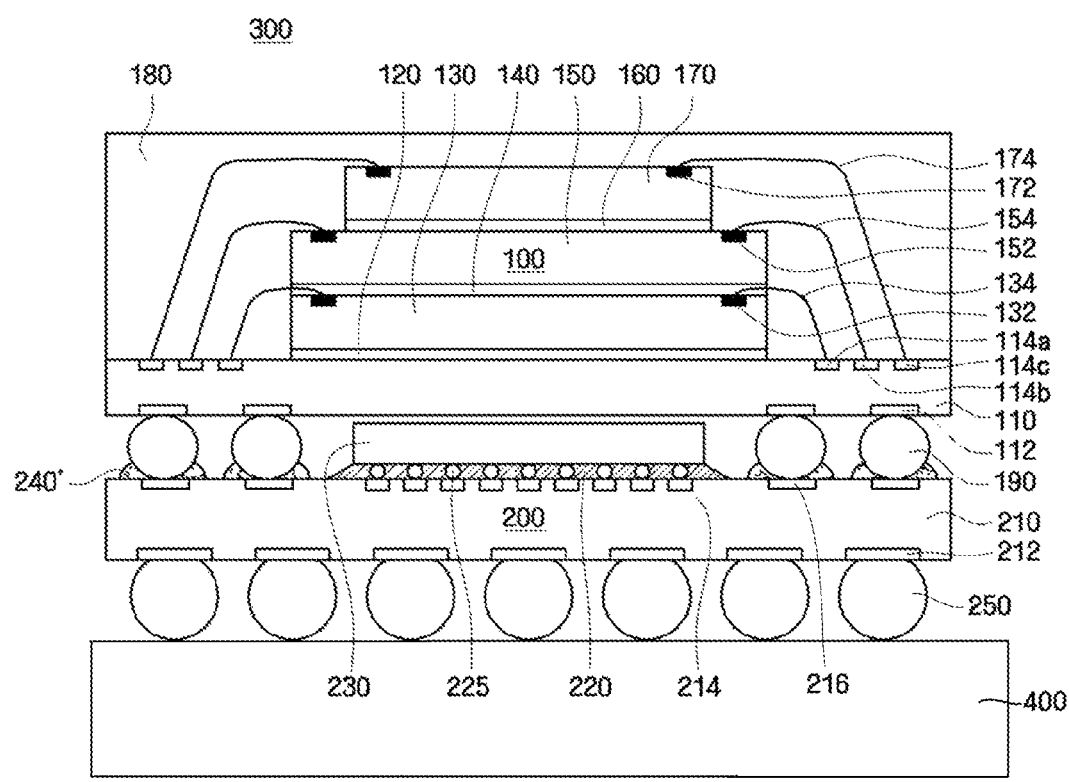
FIG. 6 is a cross-sectional view illustrating an exemplary method of mounting a stacked package fabricated by the method shown in FIGS. 1 to 5, according to one exemplary embodiment.

Referring to FIG. 5, in one embodiment, conductive second solders 250 contacting and electrically connected to pads 212 for external connection terminals are formed on the bottom surface of the lower package substrate 210. The second solders 250 may be components for electrically connecting the stacked package 300 to, for example, a module board or a main circuit board. The second solders 250 may be formed to be in contact with the pads 212 for external connection terminals using a soldering process, and may be, for example, solder bumps or solder balls including a third solder material different from the first solder material of the first solders 190 and the second solder material of the solder paste nodes 240.

For example, the second solders 250 may have a melting temperature lower than the first melting temperature of the first solders 190 and the third melting temperature of the transformed solder paste nodes 240'. As such, the second solders 250 may have a melting temperature lower than that of the inter-package bonding units. A melting temperature of the second solders 250 is referred to as a fourth melting temperature. The fourth melting temperature may be a predetermined amount, for example, 20° C. to 30° C., lower than the first melting temperature. The second solders 250 may include, for example, a Sn—Au—Cu based alloy. Thus, the fourth melting temperature may be approximately 240° C., but the present disclosure is not limited thereto.

According to one embodiment, after the stacked package 300 is fabricated by the process described with reference to FIGS. 1 to 5, the stacked package 300 may be mounted on a predetermined board in order to manufacture a desired semiconductor module, which is described in more detail below with reference to FIG. 6.

Referring to FIG. 6, a stacked package 300 and a board 400 on which the stacked package 300 is to be mounted, for example, a module board or a main circuit board, are provided. Hereinafter, the board 400 on which the stacked package 300 is to be mounted is referred to as a package mounting board 400.

Next, the stacked package 300 is disposed on one surface of the package mounting board 400 such that one surface of the package mounting board 400 contacts the second solders 250 of the stacked package 300, followed by annealing, thereby attaching the second solders 250 and the package mounting board 400 to each other. The annealing may be performed by a reflow process. Here, the annealing is performed at a temperature higher than the fourth melting temperature of the second solders 250 and lower than the first melting temperature of the inter-package bonding unit, that is, the first melting temperature of the first solders 190 and the third melting temperature of the transformed solder paste nodes 240'. In addition, in one embodiment, the annealing is performed at a temperature closer to the fourth melting temperature than to the first and third melting temperatures. As described above, when the first melting temperature is approximately 270° C., the third melting temperature is lower than or equal to 300° C., and the fourth melting temperature is approximately 240° C., for example, the annealing may be performed at a temperature of, for example, approximately 250° C. When the annealing is performed within the temperature range stated above, the inter-package bonding units, that is, first solders 190 and the transformed solder paste nodes 240', are not melted while the second solders 250 are melted to then be attached to the package mounting board 400.

The methods of fabricating and mounting the stacked package 300 according to certain embodiments described above have the following exemplary effects and advantages.

First, since the process described in FIG. 3 including the stacking of the upper semiconductor package 100 on the lower semiconductor package 200 is performed in the range of temperature higher than or equal to the second melting temperature of the solder paste nodes 240 and closer to the second melting temperature, a thermal load applied to the package, can be reduced (e.g., as compared to a conventional package stacking process).

In addition, as shown in FIG. 4, once the upper semiconductor package 100 is stacked on the lower semiconductor package 200, the inter-package bonding unit has a stacked package structure including the transformed solder paste nodes 240' having a relatively high melting temperature and the first solders 190. Therefore, the inter-package bonding unit is not melted during the process described in FIG. 6, for example during the mounting of the stacked package 300 on the package mounting board 400. Accordingly, various defects associated with the inter-package bonding unit being melted, such as an electrical short between adjacent inter-package bonding units or delamination of the upper semiconductor package 100, can be prevented.

Further, since the upper semiconductor package 100 is not delaminated during the mounting of the stacked package 300 shown in FIG. 6 but remains fixed with the lower semiconductor package 200, the lower semiconductor package 200 is prevented from being twisted or warping, thereby facilitate the mounting of the stacked package 300.

Figure 7:
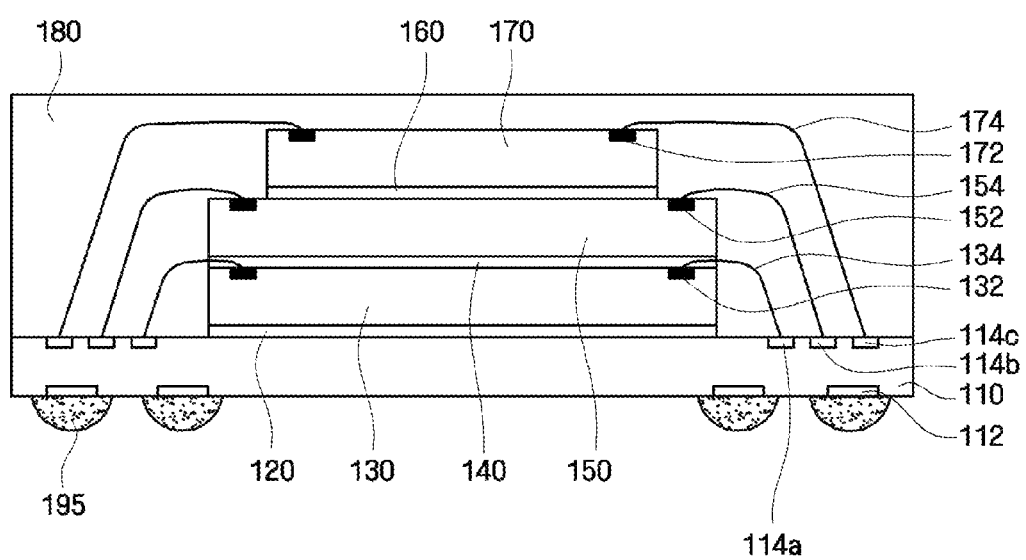
FIGS. 7 to 9 are cross-sectional views illustrating a method of fabricating a stacked package according to another exemplary embodiment.
Figure 8:
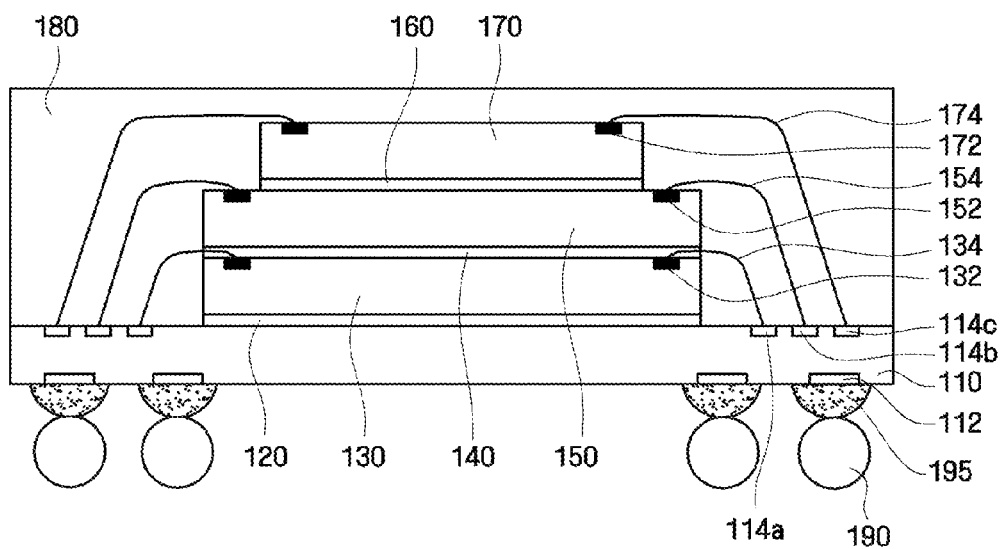
Figure 9:
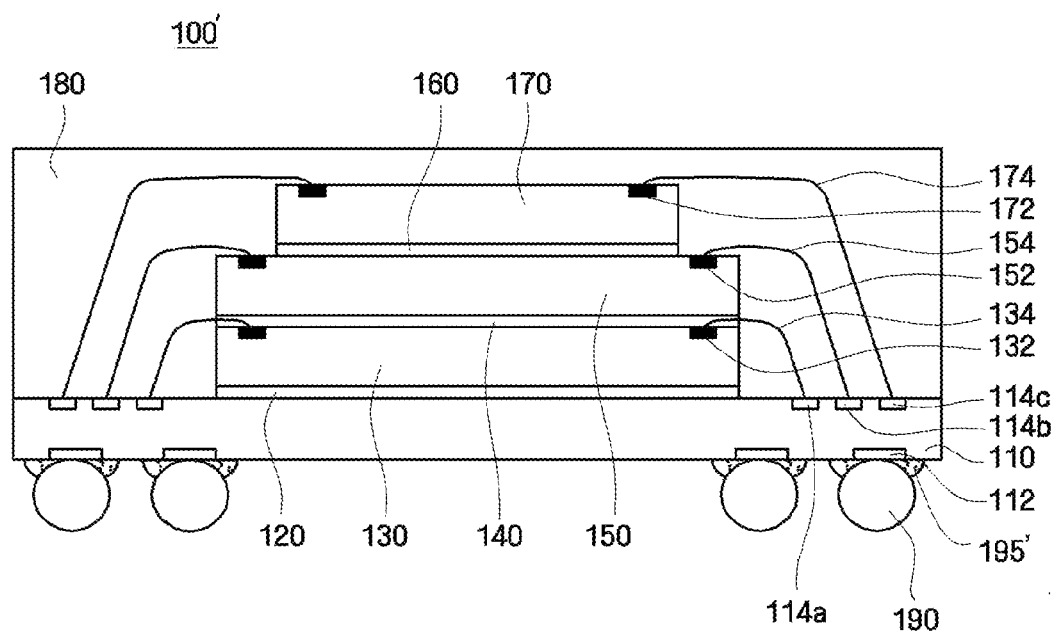

Hereinafter, a method of fabricating a stacked package according to another exemplary embodiment will be described with reference to FIGS. 7 to 9. FIGS. 7 to 9 are cross-sectional views illustrating a method of fabricating a stacked package according to another embodiment. The method of fabricating a stacked package according to the embodiment of FIGS. 7 to 9 is nearly the same as the method of fabricating a stacked package according to the previous embodiment. Thus, the same functional components as those of the previous embodiment are denoted by the same reference numerals and descriptions thereof will be given briefly or skipped.

Referring to FIG. 7, a structure is provided, including an upper package substrate 110, upper semiconductor chips 130, 150 and 170 formed on a top surface of the upper package substrate 110, and an upper molding member 180 formed on the top surface of the upper package substrate 110 and covering the upper semiconductor chips 130, 150 and 170.

Next, conductive solder paste nodes 195 contacting and electrically connected to a first bonding pad 112 are formed on a bottom surface of the upper package substrate 110. In one embodiment, the conductive solder paste nodes 195 may be formed of the same solder material as the solder paste node 240 described previously and may have substantially the same characteristics and melting temperature as the solder paste nodes 240.

Referring to FIG. 8, the first solders 190 are disposed on the bottom surface of the solder paste 195 such that it contacts the solder paste 195 and annealing is performed to attach the first solders 190 and the solder paste 195 to each other. The annealing may be performed by a reflow process. In one embodiment, the annealing is performed at a temperature lower than the first melting temperature of the first solders 190 and higher than the second melting temperature of the solder paste 195. In addition, the annealing is performed at a temperature closer to the second melting temperature than to the first melting temperature. When the annealing is performed within the temperature range stated above, the first solders 190 are not melted while the solder paste 195 is melted to then be attached to the first solders 190.

FIG. 9 shows the resultant product, that is, the upper semiconductor package 100', obtained by the process shown in FIG. 8.

Referring to FIG. 9, a material having a relatively high melting temperature, generated due to thermal transformation after the solder paste 195 is melted, such as a structure having the transformed solder paste 195' and the first solders 190 attached to each other, is formed on the first bonding pad 112 disposed on the bottom surface of the upper package substrate 100. As such, the transformed solder paste 195' may constitute a portion of the inter-package bonding unit together with the first solders 190.

In one embodiment, processes subsequent to the process of forming the upper semiconductor package 100', as shown in FIGS. 7 to 9, are the same as the processes shown in FIGS. 2 to 6. Accordingly, in one embodiment, the same stacked package and the stacked package mounted structure as those according to the previous embodiment can be obtained except that the inter-package bonding unit has a stacked structure of the transformed solder paste 240', the first solders 190 and the transformed solder paste 195'.

Since the transformed solder paste 195' has a relatively high melting temperature, it is not melted in the package stacking process shown in FIG. 3 or in the package mounting process shown in FIG. 6. Therefore, at least same effects and advantages as those of the previous embodiment can be rendered. In addition, in a case of attaching the first solders 190 using the solder paste 195, the process temperature is further lowered, and a thermal load applied to the upper semiconductor package 100' in the process of forming the upper semiconductor package 100', can further be reduced.

The chips and packages described herein can include different types of chips and/or packages. For example, memory chips and/or logic chips may be included in the stacks of chips. If memory chips are used, they may include different types of memory, such as DRAM, SRAM, NAND flash, or other types of memory. The packages 100 and 200 can be individual packages including one chip or a plurality of chips, or can be package-on-package devices including multiple packages.

While the present disclosure has been particularly shown and described with reference to exemplary embodiments thereof, it will be understood by those of ordinary skill in the art that various changes in form and details may be made therein without departing from the spirit and scope of the present embodiments as defined by the following claims. For example, in one embodiment, solder paste nodes can be used on the upper semiconductor package 100, and solders can be used on the lower semiconductor package 200 to form the inter-package bonding units, to achieve the same benefits described in the embodiments above. In another embodiment, a mix can be used where some of the terminals on the upper semiconductor package 100 for forming inter-package bonding units are initially solders and others are initially solder paste nodes, and the corresponding terminals on the lower semiconductor package 200 are the opposite types of terminals as on the upper semiconductor package 100. It is therefore desired that the present embodiments be considered in all respects as illustrative and not restrictive, reference being made to the appended claims rather than the foregoing description to indicate the scope of the invention.

We claim:

1. A method of fabricating a stacked semiconductor package, the method comprising:
    providing an upper semiconductor package including an upper package substrate, upper semiconductor chips formed on a top surface of the upper package substrate, and first solders formed on a bottom surface of the upper package substrate and having a first melting temperature;
    providing a lower semiconductor package including a lower package substrate, lower semiconductor chips formed on a top surface of the lower package substrate, and solder paste nodes formed on the top surface of the lower package substrate and having a second melting temperature lower than the first melting temperature; and
    forming inter-package bonding units by bonding respective first solders and solder paste nodes to each other by performing annealing at a temperature higher than the second melting temperature and lower than the first melting temperature,
    wherein in the forming of the inter-package bonding unit and performing annealing, the solder paste nodes are transformed into a material having a third melting temperature higher than the first melting temperature, and the inter-package bonding unit includes the transformed solder paste nodes and the first solders.

2. The method of claim 1, wherein the first solders include a Sn—Sb based alloy or Sn—Ag based alloy.

3. The method of claim 2, wherein the solder paste nodes include CuSn or CuSnAg.

4. The method of claim 1, further comprising forming second solders having a fourth melting temperature lower than the first and third melting temperatures on a bottom surface of the lower package substrate.

5. The method of claim 4, wherein the second solders include a Sn—Au—Cu based alloy.

6. The method of claim 1, wherein in the forming of the inter-package bonding unit, the annealing is performed at a temperature closer to the second melting temperature than to the first melting temperature.

7. The method of claim 1, wherein in the forming of the inter-package bonding unit, the annealing is performed by a reflow process.

8. The method of claim 1, wherein the providing of the upper semiconductor package comprises attaching the first solders to a bottom surface of the upper package substrate by a soldering process.

9. The method of claim 1,
    wherein in the forming of the inter-package bonding unit, the solder paste nodes are transformed into transformed solder paste nodes having a third melting temperature higher than the first melting temperature, and the inter-package bonding unit includes the transformed solder paste nodes and the first solders, and
    wherein the same material as the transformed solder paste nodes is interposed between the bottom surface of the upper package substrate and the first solders.

10. The method of claim 9, wherein the providing of the upper semiconductor package comprises:
    forming the same material as the solder paste on the bottom surface of the upper package substrate;
    disposing the first solders on the same material as the solder paste; and
    attaching the same material as the solder paste to the first solders by performing annealing at a temperature higher than the second melting temperature and lower than the first melting temperature.

11. The method of claim 1, wherein the forming of the first solders comprises attaching the first solders to a bottom surface of the upper package substrate by a soldering process.

12. A method of mounting a stacked semiconductor package, the method comprising:
    providing the stacked semiconductor package fabricated by the method of claim 1, wherein in the forming of the inter-package bonding unit, the solder paste nodes are transformed into a material having a third melting temperature higher than the first melting temperature, and the inter-package bonding unit includes the transformed solder paste nodes and the first solders;
    forming second solders on a bottom surface of the lower package substrate, the second solders having a fourth melting temperature lower than the first and third melting temperatures; and
    mounting the stacked semiconductor package on a package mounting board by attaching the package mounting board to the second solders by performing annealing at a temperature higher than the fourth melting temperature and lower than the first and third melting temperatures.

13. The method of claim 12, wherein in the mounting of the stacked semiconductor package, the annealing is performed at a temperature closer to the fourth melting temperature than to the first and third melting temperatures.

14. The method of claim 12, wherein in the mounting of the stacked semiconductor package, the annealing is performed by a reflow process.

15. A method of fabricating a stacked semiconductor package, the method comprising:
    providing an upper semiconductor package including an upper package substrate, one or more upper semiconductor chips formed on a first surface of the upper package substrate, and either first solders or first solder paste nodes formed on a second surface of the upper package substrate and having a first melting temperature;

providing a lower semiconductor package including a lower package substrate, one or more lower semiconductor chips formed on a first surface of the lower package substrate, and either second solder paste nodes or second solders formed on the first surface of the lower package substrate and having a second melting temperature, wherein either the first solders are provided such that the second solder paste nodes are provided and the second melting temperature is lower than the first melting temperature, for the first solder paste nodes are provided such that the second solders are provided and the second melting temperature is higher than the first melting temperature; and forming inter-package bonding units by, when the first solders are provided, bonding the first solders and the second solder paste nodes to each other, and when the second solders are provided, bonding the first solder paste nodes and the second solders to each other, by performing annealing at a temperature between the second melting temperature and the first melting temperature, wherein when performing the annealing to the first solders and the second solder paste nodes, the second solder paste nodes of the inter-package bonding units are transformed into a material having a third melting temperature higher than the first melting temperature of the first solders of the inter-package bonding units, and the inter-package bonding units include the transformed second solder paste nodes and the first solders; and when performing the annealing to the second solders and the first solder paste nodes, the first solder paste nodes of the inter-package bonding units are transformed into a material having a third melting temperature higher than the second melting temperature of the second solders of inter-package bonding units, and the inter-package bonding units include the transformed first solder paste nodes and the second solders.

16. The method of claim 15, wherein:
the upper semiconductor package includes the first solders having the first melting temperature;
the lower semiconductor package includes the second solder paste nodes having the second melting temperature;
the second melting temperature is lower than the first melting temperature;
forming the inter-package bonding units includes bonding the first solders and the second solder paste nodes to each other by performing annealing at a temperature higher than the second melting temperature and lower than the first melting temperature; and
the forming of the inter-package bonding unit includes transforming the second solder paste nodes into a material having a third melting temperature higher than the first melting temperature.

17. The method of claim 16, further comprising:
forming third solders having a fourth melting temperature lower than the first and third melting temperatures on a bottom surface of the lower package substrate; and
mounting the stacked semiconductor package on a package mounting board by attaching the package mounting board to the third solders by performing annealing at a temperature higher than the fourth melting temperature and lower than the first and third melting temperatures.

18. The method of claim 16, wherein:
the upper package substrate is disposed between the one or more upper semiconductor chips and the lower package substrate, and one or more lower semiconductor chips are disposed between the upper package substrate and the lower package substrate.

19. A method of fabricating a stacked semiconductor package, the method comprising:
providing an upper semiconductor package including an upper package substrate, one or more upper semiconductor chips formed on a first surface of the upper package substrate, and either first solders or first solder paste nodes formed on a second surface of the upper package substrate and having a first melting temperature;
providing a lower semiconductor package including a lower package substrate, one or more lower semiconductor chips formed on a first surface of the lower package substrate, and either second solder paste nodes or second solders formed on the first surface of the lower package substrate and having a second melting temperature,
wherein if the first solders are provided then the second solder paste nodes are provided and the second melting temperature is lower than the first melting temperature, and if the first solder paste nodes are provided then the second solders are provided and the second melting temperature is higher than the first melting temperature; and
forming inter-package bonding units by bonding either the first solders and the second solder paste nodes to each other or the first solder paste nodes and the second solders to each other by performing annealing at a temperature between the second melting temperature and the first melting temperature,
wherein:
the upper semiconductor package includes the first solder paste nodes having the first melting temperature;
the lower semiconductor package includes the second solders having the second melting temperature;
the first melting temperature is lower than the second melting temperature;
forming the inter-package bonding units includes bonding the first solder paste nodes and the second solders to each other by performing annealing at a temperature higher than the first melting temperature and lower than the second melting temperature; and
the forming of the inter-package bonding unit includes transforming the first solder paste nodes into a material having a third melting temperature higher than the second melting temperature.

* * * * *